United States Patent [19]
Arai

[11] 4,218,659
[45] Aug. 19, 1980

[54] AMPLIFIER CIRCUIT FOR A HALL-EFFECT HEAD

[75] Inventor: Takao Arai, Yokohama, Japan

[73] Assignee: Hitachi, Ltd., Japan

[21] Appl. No.: 6,912

[22] Filed: Jan. 26, 1979

[30] Foreign Application Priority Data

Jan. 27, 1978 [JP] Japan .................................. 53-7256

[51] Int. Cl.² ...................... H03F 15/00; H03F 3/183
[52] U.S. Cl. ........................................ 330/6; 330/290;
330/293; 330/311; 360/67; 360/112
[58] Field of Search ................... 330/6, 290, 293, 310, 330/311; 360/67, 112

[56] References Cited
U.S. PATENT DOCUMENTS

3,267,386  8/1966  Davis et al. ........................... 330/293

*Primary Examiner*—James B. Mullins
*Attorney, Agent, or Firm*—Craig & Antonelli

[57] ABSTRACT

A Hall-effect element is connected at one Hall current terminal to ground and at the other Hall current terminal to a DC voltage application circuit. Two Hall voltage terminals of the Hall-effect element are coupled with the base and the emitter of a first transistor, respectively. A second transistor is connected in series to the first transistor in such a way that the collector of the second transistor is fed back in current mode to the emitter of the first transistor.

8 Claims, 6 Drawing Figures

AMPLIFIER CIRCUIT FOR A HALL-EFFECT HEAD

BACKGROUND OF THE INVENTION

1. Field of the Invention

The present invention relates to a reproducing amplifier circuit for a magnetic head with a Hall element.

2. Description of the Prior Art

FIG. 1 shows a simple equivalent circuit of a Hall element, which comprises Hall current terminals 1 and 2, Hall voltage terminals 3 and 4, Hall current resistors 5 and 6, Hall voltage resistors 7 and 8 and Hall output voltage sources 9 and 10. When current $I_H$ is fed between the Hall current terminals 1 and 2 and a magnetic field with a magnetic flux density B is applied in the direction perpendicular to the terminals 1 and 2 and across the drawing, the Hall element produces between the Hall voltage terminals 3 and 4 in the direction perpendicular to the terminals 1 and 2 a total Hall output voltage $V_H$ given by the equation (1)

$$V_H = R_H B I_H \qquad (1)$$

where $R_H$ is a Hall coefficient. The Hall output voltages are produced by the sources 9 and 10 and are induced with the polarities as shown in FIG. 1.

Therefore, it is necessary to balance-drive the Hall current or to balance-amplify the Hall output voltage. When such a Hall-effect element or device is used in the magnetic head, the current drive element must be a large power supply element in order to increase the Hall current as much as possible and to improve the sensitivity for the purpose of improving the signal-to-noise (S/N) ratio. Therefore, it is unpreferable to balance-drive the Hall current. For this, it has commonly been employed a method that the Hall currents are subjected to unbalanced drive by grounding either one of the terminals 1 and 2, while the Hall output voltages are subjected to balanced amplification by grounding neither of the terminals 3 and 4.

FIG. 2 shows a conventional playback amplifier circuit for amplifying the Hall output voltage of this type Hall-effect element. The Hall voltage amplifier circuit comprises differential input terminals 11 and 12 an amplifier output terminal 13, a power supply terminal 14, transistors 15 and 18, resistors 19 to 27 and capacitors 28 to 32. The input terminals 11 and 12 shown in FIG. 2 are coupled with the Hall voltage terminals 3 and 4 shown in FIG. 1, respectively. The Hall current terminal 2 is connected to ground. The Hall current terminal 1 is connected to a DC current supply circuit (source). In operation, signals inputted into the differential input terminals 11 and 12 are subtracted one from the other since transistors 15 and 16 are coupled to each other in a differential manner. The subtracted signal is amplified by the transistor 18 and then is negatively fed back through the resistor 25 to the transistor 16. Accordingly, Hall output voltages 9 and 10 shown in FIG. 1 and thermal noise due to the Hall voltage resistors 7 and 8 are amplified and are developed at the output terminal 13. Thermal noises produced by the Hall current resistors 5 and 6 do not appear at the output terminal 13 since they are cancelled to each other. The gain of the amplifier is determined by the ratio between the resistor 25 and the Hall voltage resistor 8. As mentioned above, the amplifier circuit is advantageous in that, while the noises caused by the Hall current resistors are cancelled from each other, the balanced output signal is amplified. But it is disadvantageous in that, since two transistors 15 and 16 are used in differential connection, noise generated by the transistors per se is increased by 3 dB, compared to the case of using a single transistor. Particularly, when the resistances of the Hall voltage terminal resistors 7 and 8 are small, the noise generated by the transistor per se is problematic. For example, when the resistances of the Hall voltage terminal resistors 7 and 8 are in the order of 100 to 150 ohms, these resistances are substantially equal to the base diffusion resistance of the transistor, so that it is impossible to design the circuit with a noise figure (NF) of 3 dB or less. In this case, low-noise circuit design therefore needs balanced drive for the Hall currents and unbalanced amplification for the Hall output voltages. Therefore, the Hall current drive circuit has to be of the balanced drive type using large power supply element as mentioned above.

SUMMARY OF THE INVENTION

Accordingly, an object of the present invention is to provide an amplifier circuit for use in a magnetic head using a Hall-effect element, which obviates the drawbacks of the prior art and reduces the significant deterioration of a picked-up signal due to noise.

In accordance with the present invention, a playback amplifier circuit for a magnetic head having a Hall-effect element is provided in which balanced signals of Hall output voltages are differentially applied between the base and emitter of a single transistor to therby reduce noise in the circuit.

Other objects and features of the invention will be apparent from the following description of the embodiments of the present invention taken in connection with the accompanying drawings.

DESCRIPTION OF THE PREFERRED EMBODIMENTS

Figure 2:
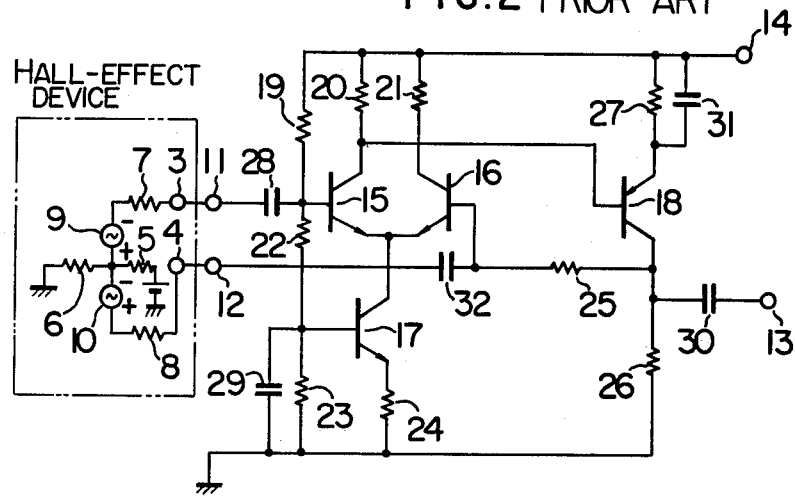
FIG. 2 is a circuit diagram of a conventional amplifier circuit for a magnetic playback head using a Hall-effect element.
Figure 3:
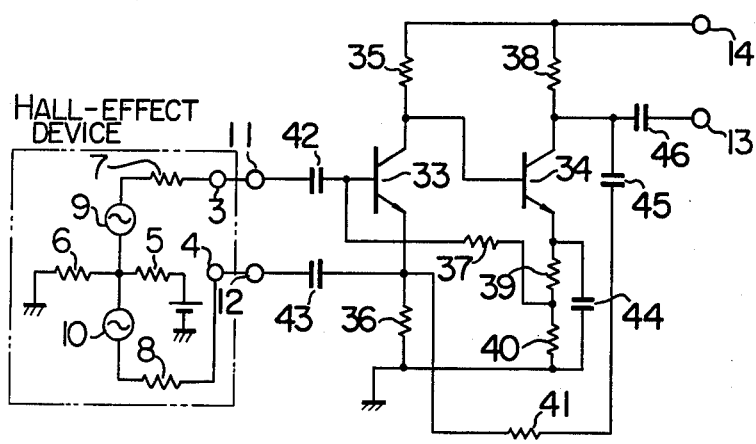
FIG. 3 is a circuit diagram of an embodiment of an amplifier circuit for a magnetic playback head with a Hall-effect element according to the present invention.

FIG. 3 shows a circuit diagram of a playback amplifier circuit for a magnetic head using a Hall-effect device in accordance with an embodiment of the invention. In FIG. 3, the playback amplifier circuit comprises differential input terminals 11 and 12, an amplifier output terminal 13, a power supply terminal 14, transistors 33 and 34, resistors 35 to 41 and capacitors 42 to 46. The transistors 33 and 34 are coupled to form a common emitter type amplifier circuit in a two-stage series connection. The first-stage transistor 33 is connected at its collector to the base of the second-stage transistor 33. In FIG. 3, the differential input terminals 11 and 12 are coupled to the Hall voltage terminals 3 and 4 of FIG. 1, respectively, in such a manner as shown in FIG. 2. In the circuit, the Hall current terminal 2 is connected to ground and the Hall current terminal 1 is connected to a DC current supply source. In this case, since the emitter of the transistor 33 is connected to the collector of the transistor 34, through the resistor 41 and the capacitor 45, when two input signals to be differentially added from the input terminals 11 and 12 are applied between the base and the emitter of the transistor 33 respectively, the transistor 33 receives a feedback current through the resistor 41, so that the emitter of the transistor 33 is at a voltage substantially equal to that of its base. In this circuit, a differential circuit construction can be realized by using the base-emitter circuit of the transistor 33, with the result that the transistor noise may be reduced by 3 dB, compared to the conventional dualtransistor differential amplifier. Thus, its noise is merely the noise in the case of using a single transistor. This fact will be now reviewed in terms of the noise figure NF. Assume that the resistance of each of the Hall voltage resistors 7 and 8 is 150 ohms and the equivalent noise resistance of the transistor used is 150 ohms. In the conventional circuit shown in FIG. 2, two transistors 15 and 16 are used and therefore the noise figure is $20 \log \sqrt{600}/\sqrt{300} = 3$ dB. On the other hand, in the circuit of FIG. 3 according to the invention, only one transistor 33 is satisfactorily used, although the same transistor is used so that the noise figure is $20 \log \sqrt{450}/\sqrt{300} = 1.7$ dB and is thus improved by more than 1 dB. In this manner, the circuit in FIG. 3 improves the noise figure. However, when the emitter resistor 36 of the transistor 33 is small, the Hall voltage input signal inputted to the input terminal 12 is bypassed through the resistor 36, so that the input voltage applied to the termnaal 12 is attenuated. The Hall voltage input signal inputted to the input terminal 11 is not attenuated, since the bias resistor 37 is large in resistance.

Figure 4:
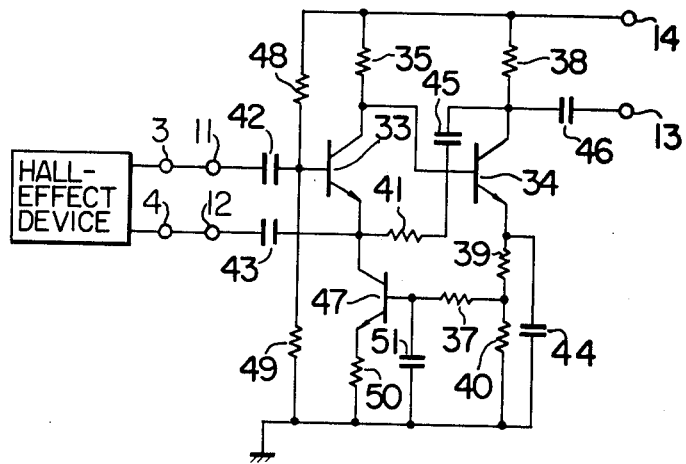
FIG. 4 is a circuit diagram of another embodiment of a playback-signal amplifying circuit according to the present invention.

FIG. 4 is another embodiment showing a modification of FIG. 3 in which a transistor is used in place of the resistor 36 shown in FIG. 3 to provide a sufficiently increased impedance for the emitter resistor. In FIG. 4, the amplifier circuit comprises differential input terminals 11 and 12, an amplifier output terminal 13, a power supply terminal 14, a transistor 47, resistors 48 to 50 and a capacitor 51. As seen from the drawings, the resistor 36 in FIG. 3 is replaced by the transistor 47 which constitutes a constant current circuit, whereby the emitter-side input impedance exhibits 500 KΩ or more which is much larger than the resistance of the Hall voltage resistor 8. In this embodiment, the collector of the transistor 47 is connected to the emitter of the transistor 33, the emitter thereof to ground through the resistor 50 and the base thereof to the connection point between the resistors 39 and 40, through the resistor 37. The series-connected resistors 39 and 40 constitute an emitter resistor connected between the emitter of the transistor 34 and ground. The capacitor 44 is connected across the resistors 39 and 40. The base of the transistor 47 is grounded through the capacitor 51. A DC voltage applied between the resistors 39 and 40 is divided thereby and the divided voltage is applied to the base of the transistor 47 through resistor 37 to thereby increase the collector-emitter impedance of the transistor 47 as viewed from the collector side of the transistor 47. In accordance with the principle of such a construction, an emitter impedance of 500 KΩ or more may easily be designed. The capacitor 51 serves to bypass noise appearing at the connection point between the capacitor 51 and the resistor 37 to thereby prevent the noise from going to the transistor 47.

Because of the use of the constant current circuit by the transistor 47, the circuit of FIG. 4 can prevent any signal voltage applied to the input terminal 12 from being attenuated. However, the use of the transistor 47 may cause its inherent noise. For this reason, the circuit design must be made such that noise components generated by a circuit including the transistor 47 and the resistor 50 as well are smaller than those generated by the Hall voltage resistors 7 and 8.

Figure 1:
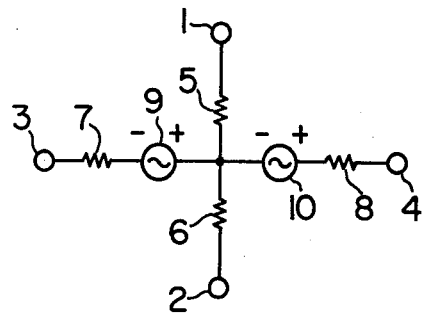
FIG. 1 is an equivalent circuit of a Hall-effect element.

As shown, the emitter of the transistor 47 is connected to the resistor 50 and the collector thereof is connected to the Hall voltage resistor 8 of the Hall-effect element in FIG. 1 through the input terminal 12. Assuming that R1 is the resistance of the Hall voltage resistor 8, R2 is the resistance of the resistor 50 and $R_T$ is the equivalent noise resistance of the transistor 47, the gain of the transistor 47 is accordingly given by R1/R2. The noise voltage of the Hall voltage resistor 8 is represented by a product of a proportional coefficient and $\sqrt{R1}$ and the noise voltage of the sum of the resistor 50 and the transistor 47 is represented by a product of the coefficient and $\sqrt{R2+R_T}$. Therefore, in order to make the noise due to the transistor 47 and the resistor 50 lower than that due to the transistor 37 and the Hall voltage resistors 7 and 8, a design to meet the following equation is necessary $$\sqrt{R1} >> R1/R2\sqrt{R2+R_T} \qquad (2)$$

For example, when $R1 = 150$ ohms and $R_T = 150$ ohms, R2 must satisfy the following equation $$R2 >> (R1+\sqrt{R1^2+4R1R_T})/2 \approx 242 \qquad (3)$$

Therefore, in the circuit shown in FIG. 4, when the resistance R2 of the resistor 50 is 242 ohms, the noise figure is 3 dB as similarly as in the circuit of FIG. 2. When the resistor R2 is selected at 2.5 KΩ in accordance with the equation (3), the noise figure is approximately 1.8 dB and hence is substantially the same as the case of FIG. 3.

Consequently, the circuit configuration of FIG. 4 to satisfy the equation (2) can reduce the noise but can avoid the attenuation of the Hall voltage signal.

Figure 5:
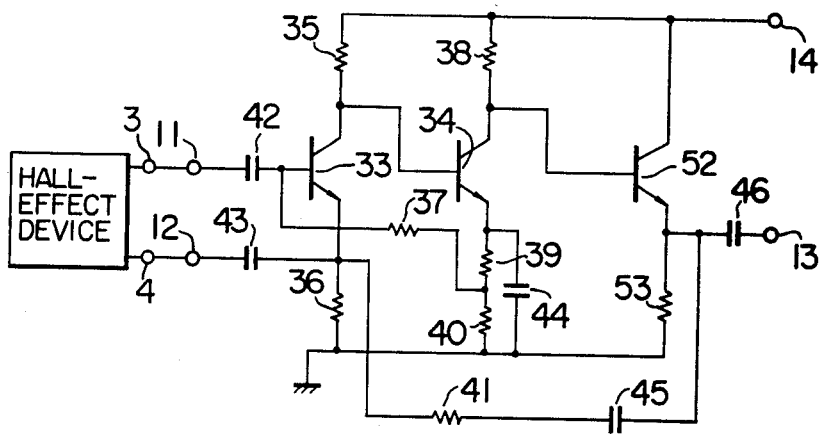
FIGS. 5 and 6 are circuit diagrams showing other embodiments of the present invention, respectively.
Figure 6:
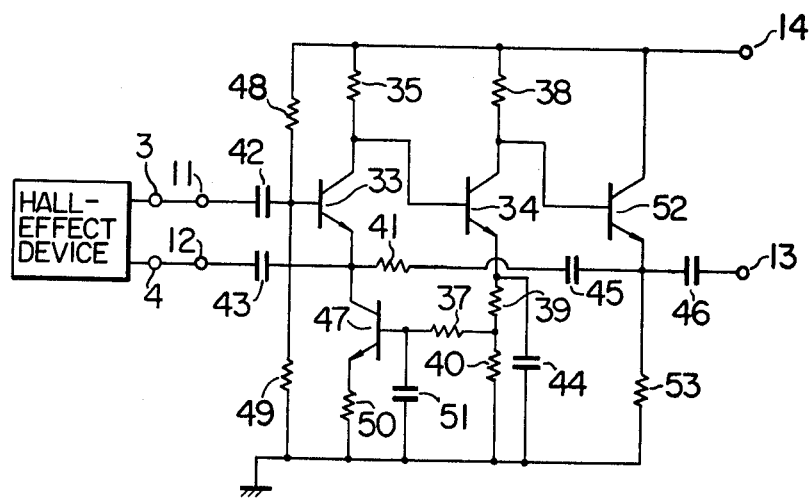

The playback amplifier circuits shown in FIGS. 5 and 6 provide low-distortion large output power signals, compared to those in FIGS. 3 and 4. In FIGS. 3 through 6, the negative feedback resistor 41 determines an overall gain G of the amplifier circuit including the negative feedback path in each of FIGS. 3 and 4. Consideration is made of an overall gain A of the amplifier circuit in the case where no negative feedback is applied. In such a situation, the load for the transistor 34 in FIGS. 3 and 4 includes the resistor 38 and the negative feedback resistor 41 as well. The resistor 41, however, is selected in its value to determine the overall gain G, as described above, and its value is usually several kiloohms. Therefore, even if the resistance value of the resistor 38 is made large, the gain A is restricted by the feedback resistor 41 so that it is impossible to make large the signal appearing at the output terminal 13. The embodiments shown in FIGS. 5 and 6 solve this problem. In addition, the distortion of the whole amplifier circuit is also reduced by A/G. Therefore, the gain A is desirably designed to be more large. In FIGS. 5 and 6, another transistor 52 is provided at the succeeding stage of the transistor 34 in emitter-follower connection, to thereby form an AC feedback path from the emitter of the transistor 52 to the first-stage transistor 33. The base of the transistor 52 is connected to the collector of the transistor 34. The transistor 52 is further connected at its collector to the power supply terminal 14 and at its emitter to ground through a resistor 53 and also to the output terminal 13 through the capacitor 46 and further to the emitter of the transistor 33 through the capacitor 45 and the resistor 41. In this circuit, the negative feedback resistor 41 is separated from the load resistor 38 of the transistor 34, so that the load of the amplifier circuit is determined only by the resistor 38. Accordingly, if the resistance of the resistor 38 is selected larger, the gain A may be made large, and thus a large output signal may be provided at the output terminal 13.

In the embodiments shown in FIGS. 3 through 6, NPN transistors are used as active components, but PNP transistors or FETs are similarly applicable to the same.

The present playback amplifier circuit for a magnetic head using a Hall-effect element can improve the noise by 3 dB and the noise figure by at least 1 dB greater than in the prior art circuit, by a simple circuit construction.

I claim:

1. An amplifier circuit for a Hall-effect head comprising a Hall-effect element with two Hall current terminals and two Hall voltage terminals in which one Hall current terminal is connected to ground and the other to a DC voltage supply circuit, comprising:
   a first transistor having its base and emitter to be connected to said two Hall voltage terminals, respectively to provide a differential output at its collector;
   a second transistor connected in cascade to said first transistor providing an output of the circuit; and
   an AC feedback circuit connected between the collector of said second transistor and the emitter of said first transistor.

2. An amplifier circuit for a Hall-effect head comprising:
   a Hall-effect element with two Hall current terminals and two Hall voltage terminals in which one Hall current terminal is connected to ground and the other to a DC voltage supply circuit;
   a first transistor connected at its base and emitter to said two Hall voltage terminals, respectively;
   a second transistor connected in cascade to said first transistor providing an output of the circuit; and
   an AC feedback circuit connected between the collector of said second transistor and the emitter of said first transistor;
   a third transistor connected at its collector to the emitter of said first transistor to constitute a constant current circuit;
   an impedance element connected to the emitter of said third transistor for providing an emitter impedance for said first transistor, together with said third transistor; and
   a second DC voltage supply circuit connected to the base of said third transistor.

3. An amplifier circuit according to claim 2, in which said impedance element is a resistor.

4. An amplifier circuit according to claim 3, in which said resistor has a resistance greater than $(R1+\sqrt{R1^2+4R1R_T})/2$ where R1 is ½ of the resistance between the Hall voltage terminals, and $R_T$ an equivalent noise resistance of the third transistor constituting said constant current circuit.

5. An amplifier circuit for a Hall-effect head comprising:
   a Hall-effect element with two Hall current terminals and two Hall voltage terminals in which one Hall current terminal is connected to ground and the other to a DC voltage supply circuit;
   a first transistor connected at its base and emitter to said two Hall voltage terminals, respectively;
   a second transistor connected in cascade to said first transistor;
   a third transistor connected in series to said second transistor; and
   an AC feedback circuit connected between the emitter of said third transistor and the emitter of said first transistor.

6. An amplifier circuit for a Hall-effect head comprising:
   a Hall-effect element with two Hall current terminals and two Hall voltage terminals in which one Hall current terminal is connected to ground and the other to a DC voltage supply circuit;
   a first transistor connected at its base and emitter to said two Hall voltage terminals, respectively;
   a second transistor connected in cascade to said first transistor;
   a third transistor connected in series to said second transistor;
   an AC feedback circuit connected between the emitter of said third transistor and the emitter of said first transistor;
   a fourth transistor connected at its collector to the emitter of said first transistor to constitute a constant current circuit;
   an impedance element connected to the emitter of said fourth transistor; and
   a second DC voltage supply circuit connected to the base of said fourth transistor.

7. An amplifier circuit according to claim 6, in which said impedance element is a resistor.

8. An amplifier circuit according to claim 7, in which said resistor has a resistance greater than $(R1+\sqrt{R1^2+4R1R_T})/2$ where R1 is ½ of the resistance between the Hall voltage terminals, and $R_T$ an equivalent noise resistance of the fourth transistor constituting said constant current circuit.

* * * * *